(12) United States Patent
Hwang et al.

(10) Patent No.: US 11,452,207 B2
(45) Date of Patent: *Sep. 20, 2022

(54) FLEXIBLE CIRCUIT FILM AND DISPLAY APPARATUS HAVING THE SAME

(71) Applicant: Samsung Display Co., Ltd., Yongin-si (KR)

(72) Inventors: Jun-Ho Hwang, Asan-si (KR); Jang-Mi Lee, Busan (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/215,111

(22) Filed: Mar. 29, 2021

(65) Prior Publication Data
US 2021/0219429 A1 Jul. 15, 2021

Related U.S. Application Data

(63) Continuation of application No. 16/425,996, filed on May 30, 2019, now Pat. No. 10,980,118, which is a (Continued)

(30) Foreign Application Priority Data

Jun. 3, 2014 (KR) .................. 10-2014-0067589

(51) Int. Cl.
*H05K 1/14* (2006.01)
*H01L 27/32* (2006.01)
(Continued)

(52) U.S. Cl.
CPC .......... *H05K 1/147* (2013.01); *G02F 1/1345* (2013.01); *H01L 27/3276* (2013.01);
(Continued)

(58) Field of Classification Search
CPC ...... H05K 1/147; H05K 1/028; H05K 1/0281; H05K 2201/10128; H05K 2201/10136;
(Continued)

(56) References Cited

U.S. PATENT DOCUMENTS 5,892,657 A 4/1999 Inoue
6,118,665 A 9/2000 Kishida et al.
(Continued)

FOREIGN PATENT DOCUMENTS

JP 04294593 10/1992
JP 2003283061 10/2003
(Continued)

OTHER PUBLICATIONS

Non-Final Office Action dated Jun. 1, 2020, in U.S. Appl. No. 16/425,996.
(Continued)

*Primary Examiner* — Charles S Chang
(74) *Attorney, Agent, or Firm* — H.C. Park & Associates, PLC

(57) ABSTRACT

A flexible circuit film including a first flexible film, a second flexible film facing the first flexible film, and a plurality of wirings arranged between the first flexible film and the second flexible film. The wirings have different widths and bend in different directions, and a guide film including a material more rigid than the first and second flexible films is arranged on ends of the first flexible film. The guide film includes a tear-preventing portion overlapping with a bending portion of a shortest one of the wirings while covering portions of an inner edge near inner corners of a U-shaped flexible circuit film.

24 Claims, 8 Drawing Sheets

Related U.S. Application Data continuation of application No. 15/582,226, filed on Apr. 28, 2017, now Pat. No. 10,321,568, which is a continuation of application No. 14/549,780, filed on Nov. 21, 2014, now Pat. No. 9,647,050.

(51) Int. Cl.
　　*G02F 1/1345* (2006.01)
　　*H01L 51/00* (2006.01)
　　*H05K 1/02* (2006.01)

(52) U.S. Cl.
　　CPC .......... *H01L 51/0097* (2013.01); *H05K 1/028* (2013.01); *H05K 1/0281* (2013.01); *H01L 2251/5338* (2013.01); *H05K 2201/10128* (2013.01); *H05K 2201/10136* (2013.01); *H05K 2201/2009* (2013.01); *Y02E 10/549* (2013.01)

(58) Field of Classification Search
　　CPC .......... H05K 2201/2009; G02F 1/1345; H01L 27/3276; H01L 51/0097; H01L 2251/5338; Y02E 10/549
　　USPC ................................................. 349/149–152
　　See application file for complete search history.

(56) References Cited

U.S. PATENT DOCUMENTS

| | | | |
|---|---|---|---|
| 7,399,929 B2 | 7/2008 | Ueno et al. | |
| 7,751,017 B2 | 7/2010 | Im | |
| 7,791,701 B2 | 9/2010 | Taguchi | |
| 8,102,349 B2 * | 1/2012 | Ashizawa | G02F 1/1345 349/149 |
| 8,525,822 B2 | 9/2013 | Liu et al. | |
| 9,414,504 B2 | 8/2016 | Joo | |
| 9,647,050 B2 * | 5/2017 | Hwang | H01L 51/0097 |
| 10,321,568 B2 * | 6/2019 | Hwang | H01L 51/0097 |
| 2009/0294771 A1 | 12/2009 | Kim et al. | |
| 2010/0246209 A1 | 9/2010 | Park | |
| 2011/0182046 A1 | 7/2011 | Shiota | |
| 2011/0261434 A1 | 10/2011 | Ohno et al. | |
| 2014/0078705 A1 | 3/2014 | Jo | |

FOREIGN PATENT DOCUMENTS

| | | |
|---|---|---|
| JP | 2004-179248 | 6/2004 |
| JP | 2005-339833 | 12/2005 |
| JP | 2009049079 | 3/2009 |
| JP | 2013016654 | 1/2013 |
| KR | 2001-0061268 | 7/2001 |
| KR | 10-0337272 | 8/2002 |
| KR | 10-0524479 | 1/2006 |
| KR | 10-2006-0019820 | 3/2006 |
| KR | 10-2008-0111339 | 12/2008 |
| KR | 10-2009-0013112 | 2/2009 |
| KR | 10-2010-0012993 | 2/2010 |
| KR | 10-2012-0021473 | 3/2012 |
| KR | 10-2014-0011659 | 1/2014 |
| KR | 10-2012-0039300 | 4/2014 |

OTHER PUBLICATIONS

Notice of Allowance dated Dec. 2, 2020, in U.S. Appl. No. 16/425,996.
Corrected Notice of Allowability dated Dec. 23, 2021, in U.S. Appl. No. 16/425,996.
Notice of Allowance dated Nov. 26, 2020, from Korean Patent Office Action for Korean Patent Application No. 10-2014-0067589.
Non-Final Office Action dated Aug. 10, 2018, in U.S. Appl. No. 15/582,226.
Notice of Allowance dated Feb. 1, 2019, in U.S. Appl. No. 15/582,226.
Office Action dated Sep. 27, 2021 from the Korean Patent Office for Korean Patent Application No. 10-2021-0026593.
Office Action dated Apr. 22, 2021, issued in Korean Patent Application No. 10-2021-0026593.

* cited by examiner

FLEXIBLE CIRCUIT FILM AND DISPLAY APPARATUS HAVING THE SAME

CROSS-REFERENCE TO RELATED APPLICATIONS

This application is a Continuation of U.S. patent application Ser. No. 16/425,996, filed May 30, 2019, which is a Continuation of U.S. patent application Ser. No. 15/582,226, filed Apr. 28, 2017, issued as U.S. Pat. No. 10,321,568, which is a Continuation of U.S. patent application Ser. No. 14/549,780, filed on Nov. 21, 2014, issued as U.S. Pat. No. 9,647,050, which claims priority under 35 U.S.C. § 119 to and the benefit of Korean Patent Application No. 10-2014-0067589, filed in the Korean Intellectual Property Office on Jun. 3, 2014, each of which is incorporated herein by reference in its entirety.

BACKGROUND OF THE INVENTION

Field

Exemplary embodiments relate to a flexible circuit film and a display apparatus including the flexible circuit film having improved reliability.

Discussion of the Background

A flat display apparatus such as a liquid crystal display apparatus, an organic electroluminescent display apparatus or the like is able to achieve a large-screen display with a high resolution by increasing a pixel resolution or a displaying area. For example, a liquid crystal display apparatus may include an array substrate including pixel electrodes arranged in a matrix configuration, an opposing substrate facing the array substrate, and a liquid crystal layer interposed between the array substrate and the opposing substrate. The liquid crystal display apparatus may further include a driver supplying a voltage to the pixel electrodes. For example, the driver may include a circuit part controlling an image signal.

As a size of the flat display panel increases, required signal lines also increase. Furthermore, required circuit boards included in a circuit part for providing electrical signals to the signal lines also increase. For example, a circuit part may include at least three circuit boards.

SUMMARY

Exemplary embodiments provide a flexible circuit film capable of reducing physical damage and increasing reliability of a display apparatus, which may be included when circuit boards are connected to each other.

Exemplary embodiments also provide a display apparatus including the flexible circuit film.

According to one aspect of the present invention, there is provided a flexible circuit film that includes a first flexible film, a second flexible film facing the first flexible film, a plurality of wirings arranged between the first flexible film and the second flexible film and extending in a first direction from a first terminal end portion to a first bend, then extending in a second direction crossing the first direction between the first bend and a second bend, and then extending in an opposing direction to the first direction from the second bend to a second and opposite terminal end portion and a guide film including a material having higher rigidity than that of the first and second flexible films and arranged on the first flexible film at locations corresponding to the first and second terminal end portions of the wirings, the guide film including a tear-preventing portion overlapping the first and second bends of a shortest one of the wirings.

At least two of the wirings may have different widths from each other. The wirings may include a power supply line, a ground line and a plurality of image signal supplying lines, and at least one of the power supply line and the ground line may have a width greater than that of each of the image signal supplying lines. The second flexible film may include a terminal groove exposing one of the first and second terminal end portions of the wirings. The second flexible film may also include a protective portion extending in an arranging direction of the wirings and partially covering the one of the first and second terminal end portions of the wirings. The tear-preventing portion may extend in both the first direction and in the second direction. The first and second flexible films may have a U-shape that includes a base portion that corresponds to a portion of the wirings that extend in the second direction and two branches extending from opposite ends of the base portion and corresponding to portions of the wirings extending in the first direction and opposing the first direction, the first and second flexible films including an inner edge having two inner corners that correspond to an inner portion of the U-shape where the branches meet the base, the tear-preventing portion overlapping the each of the two corners arranged at the inner edge of the flexible films having the U-shape.

According to another aspect of the present invention, there is provided a display apparatus that includes a display panel and a driver including a plurality of printed circuit boards including a driving chip and a flexible circuit film electrically connecting the printed circuit boards, the driver being configured to apply electrical signals to the display panel, wherein the flexible circuit film may include a first flexible film, a second flexible film facing the first flexible film, a plurality of wirings arranged between the first flexible film and the second flexible film and extending in a first direction from a first terminal end portion to a first bend, then extending in a second direction crossing the first direction between the first bend and a second bend, and then extending in an opposing direction to the first direction from the second bend to a second and opposite terminal end portion, and a guide film including a material having higher rigidity than that of the first and second flexible films and arranged on the first flexible film at locations corresponding to the first and second terminal end portions of the wirings, the guide film including a tear-preventing portion overlapping the first and second bends of a shortest one of the wirings.

The plurality of printed circuit boards may include a first printed circuit board and a second printed circuit board that are arranged in the first direction, the flexible circuit film may electrically connect the first printed circuit board to the second printed circuit board. The driver may include a host line configured to transfer externally provided electrical signals to one of the printed circuit boards. The driver may include a plurality of flexible circuit films that electrically connects to each other ones of the printed circuit boards that are adjacent to each other and not directly connected to the host line. The host line and the flexible circuit film may be connected to a same one of the printed circuit boards. At least two of the wirings may have different widths. The wirings may include a power supply line, a ground line and a plurality of image signal supplying lines, and at least one of the power supply line and the ground line has a width that is greater than that of each of the image signal supplying lines. The second flexible film may include a terminal groove exposing one of the first and second terminal end portions of the wirings. The second flexible film may also include a protective portion extending in an arranging direction of the wirings and partially covering the one of the first and second terminal end portions of the wirings. The tear-preventing portion may overlap at least two of the wirings at one of the first and second bends.

The display panel may also include an array substrate that includes a plurality of data lines extending in the first direction and arranged in the second direction, a plurality of gate lines extending in the second direction and arranged in the first direction and a plurality of pixel electrodes electrically connected to the data lines. The display panel may extend a greater distance along the second direction than along the first direction.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION

Exemplary embodiments will be described more fully hereinafter with reference to the accompanying drawings, in which various embodiments are shown.

Figure 1:
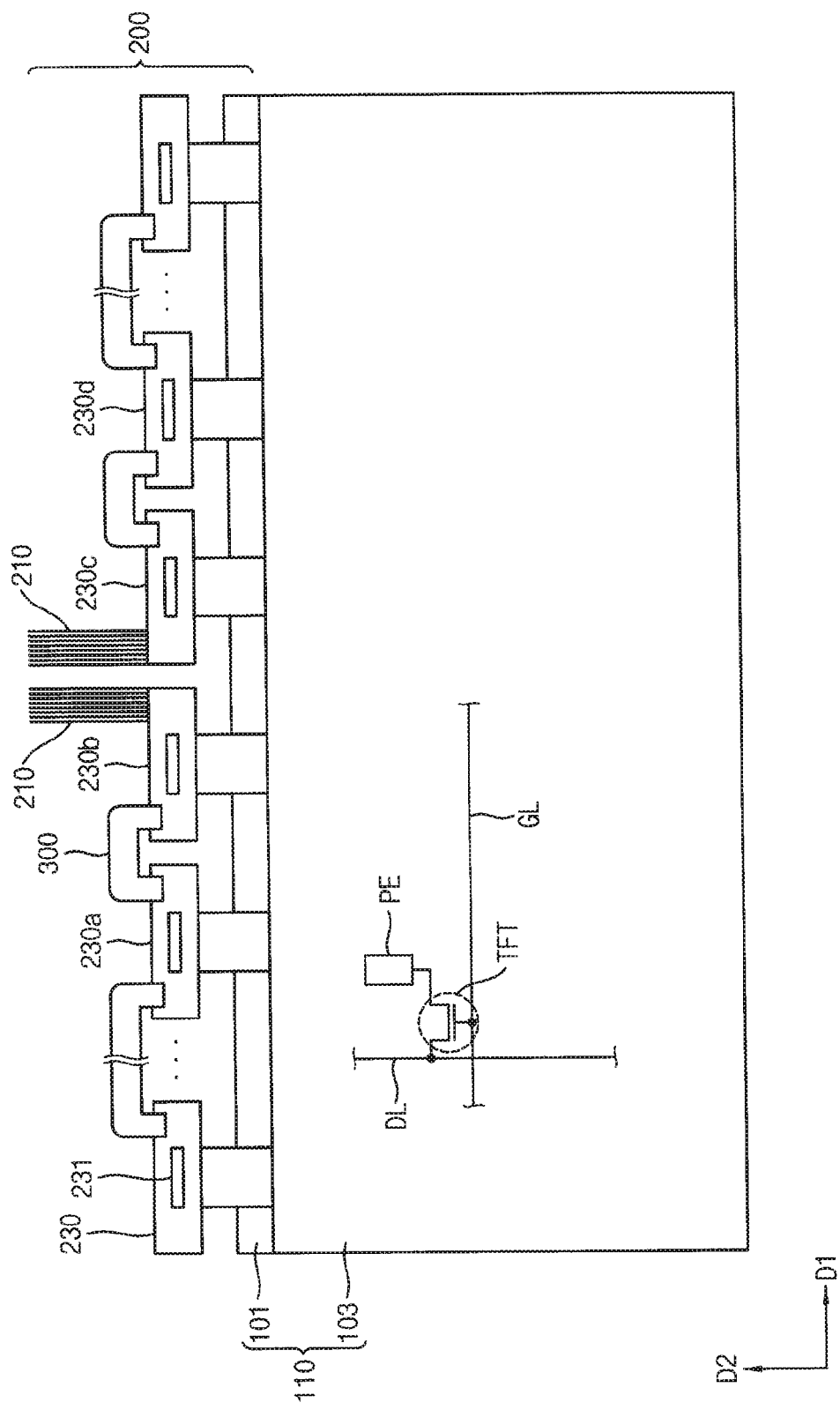
FIG. 1 is a plan view illustrating a display apparatus according to a first exemplary embodiment.

Turning now to the figures, FIG. 1 is a plan view illustrating a display apparatus according to a first exemplary embodiment. Referring to FIG. 1, a display apparatus according to a first exemplary embodiment may include a display panel 110 and a driver 200. Examples of the display panel 110 may include an organic electroluminescent display panel, a liquid crystal display panel, an electrowetting display panel, an electrophoretic display panel, a microelectromechanical system display panel, a plasma display panel and the like.

For example, the display panel 110 may include a liquid crystal display panel, which includes an array substrate 101, an opposing substrate 103 facing the array substrate 101, and a liquid crystal layer interposed between the array substrate 101 and the opposing substrate 103. The array substrate 101 may include a plurality of gate lines GL extending in a first direction D1, a plurality of data lines DL intersecting with the gate lines GL and extending in a second direction DE, a plurality of switching elements TFT electrically connected to the gate lines GL and the data lines DL, and a plurality of pixel electrodes PE electrically connected to the switching elements TFT. The array substrate 101 or the opposing substrate 103 may further include a common electrode (not shown) forming an electric field with the pixel electrodes PE. The display panel 110 has a first length in the first direction D1 greater than a second length in the second direction D2.

In another embodiment, the display panel 110 may include an organic electroluminescent display panel, which includes a plurality of organic electroluminescent structures that emit light. For example, each of the organic electroluminescent structures may include a first electrode, a second electrode facing the first electrode, and an organic electroluminescent element interposed between the first electrode and the second electrode. The organic electroluminescent element may include a hole injection layer, a hole transfer layer, an organic light-emitting layer, an electron transfer layer, an electron injection layer or the like.

The driver 200 may include a plurality of printed circuit boards 230 and a plurality of flexible circuit films 300 electrically connecting the printed circuit boards 230 to each other. The printed circuit boards 230 may include a driving chip 231 for providing electrical signals to the gate lines GL and the data lines DL. The printed circuit boards 230 may be arranged adjacent to the display panel 110. For example, the printed circuit boards 230 may be arranged to face a side or edge of the display panel 110 that extends in the first direction D1. For example, a first printed circuit board 230a, a second printed circuit board 230b, a third printed circuit board 230c and a fourth printed circuit board 230d may be arranged to face a side of the display panel 110 that extends in the first direction D1.

At least one of the printed circuit boards 230 may be connected to a host line 210 to receive electrical signals from an external device. The host line 210 may provide power signals, image signals and the like. More specifically, the host line 210 may provide gamma power signals, gate driving signals, data driving signals and the like.

The printed circuit boards adjacent to a center portion of the display panel 110 may be connected directly to the host line 210. For example, the second printed circuit board 230b and the third printed circuit board 230c may receive electrical signals directly from individual host lines 210, respectively.

The remaining printed circuit boards that are not directly connected to the host line 210 receive electrical signals from the host line 210 via the second printed circuit board 230b or the third printed circuit board 230c and the flexible circuit films 300. For example, the first printed circuit board 230a is arranged adjacent to the second printed circuit board 230b in an opposing direction to the first direction D1, and receives electrical signals from the host line 210 via second printed circuit board 230b and flexible circuit film 300. This is because in the present invention, printed circuit boards adjacent to each other may receive or provide electrical signals via the flexible circuit film 300. Thus, electrical signals provided by the host line 210 may be transferred to all printed circuit boards 230 arranged in the opposing direction to the first direction D1 by traveling through the second printed circuit board 230b.

The fourth printed circuit board 230d is arranged adjacent to the third printed circuit board 230c in the first direction D1, and receives electrical signals from the host line 210 via third printed circuit board 230c and flexible circuit film 300. This is because in the present invention, the printed circuit boards adjacent to each other may receive or provide electrical signals to each other via the flexible circuit film 300. Thus, electrical signals provided by the host line 210 may be transferred to all printed circuit boards arranged in the first direction D1 via the third printed circuit board 230c.

According to the above, electrical signals provided from an external device through the host line 210 can be transferred to the printed circuit boards 230 through the flexible circuit film 300. Thus, electrical signals may be appropriately applied to the data lines DL and the gate lines GL, even in a large-screen display apparatus.

Figure 2:
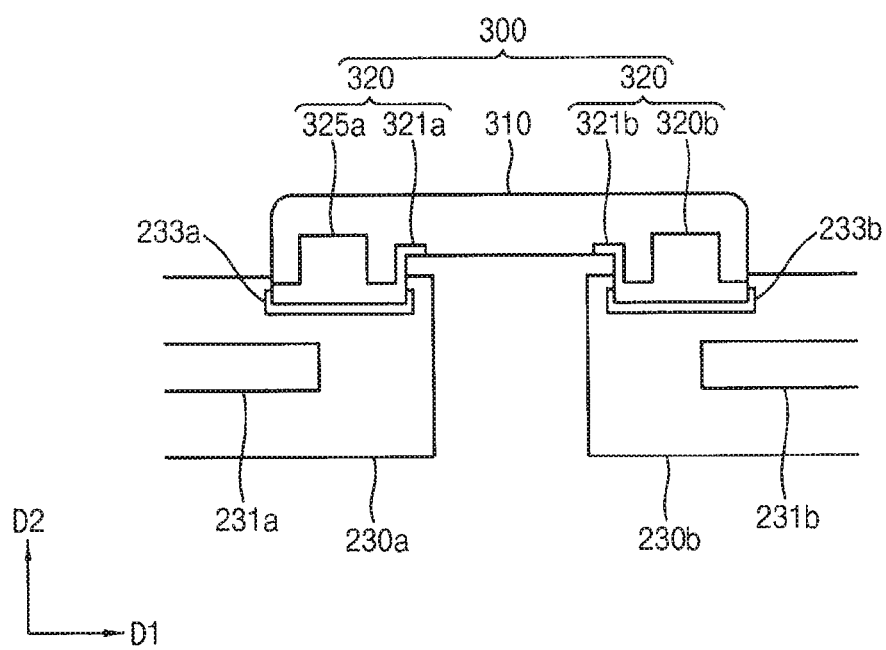
FIG. 2 is an enlarged plan view illustrating the flexible circuit film of the display apparatus of FIG. 1 according to a first exemplary embodiment of the present invention.

Turning now to FIG. 2, FIG. 2 is an enlarged plan view illustrating the flexible circuit film 300 of the display apparatus of FIG. 1 according to a first exemplary embodiment of the present invention. Referring to FIG. 2, the flexible circuit film 300 may electrically connect the first printed circuit board 230a and the second printed circuit board 230b to each other. The first printed circuit board 230a may include a first driving chip 231a and a first connecting portion 233a. The second printed circuit board 230b may include a second driving chip 231b and a second connecting portion 233b. The flexible circuit film 300 may be connected to the first connecting portion 233a and to the second connecting portion 233b.

The flexible circuit film 300 may include a flexible part 310 and a guide film 320. The flexible part 310 may have a bent shape to connect to the first connecting portion 233a to the second connecting portion 233b. For example, the flexible part 310 may have a U-shape. More specifically, the flexible part 310 may extend in the second direction D2 to correspond to one of the branches 372 of the U-shape, then have a bend to extend in the first direction D1 to correspond to a base 371 of the U-shape, and then have a second bend to extend in a direction opposite to the second direction D2 to correspond to an other of the branches 373 of the U-shape.

The guide film 320 may be attached to the flexible part 310 to be adjacent to the first and second connecting portions 233a and 233b. The guide film 320 may include a relatively more rigid material than that of the flexible part 310. For example, the guide film 320 may include polyethylene terephthalate.

The guide film 320 may include tear-preventing portions 321a and 321b to prevent the flexible part 310 from being torn. For example, the tear-preventing portion 321a and 321b may overlap with an inner edge 377 (see FIG. 3B), including the inner corners 378 and 379 of the U-shape flexible circuit film 300. For example, each tear-preventing portion 321a and 321b may have an L-shape. Thus, the flexible part 310 may be prevented from being physically damaged, for example, by being torn when the flexible circuit film 300 is coupled to the first connecting portion 233a and to the second connecting portion 233b.

The guide film 320 may further include a handling portion 325a and 325b to guide the flexible circuit film 300 when the flexible circuit film 300 is coupled to the first connecting portion 233a and to the second connecting portion 233b. The handling portions 325a and 325b may be a portion grabbed by an operator when the flexible circuit film 300 is coupled to the first connecting portion 233a and the second connecting portion 233b. The flexible circuit film 300 will be explained more fully with reference to FIGS. 3A, 3B and 4.

Figure 3A:
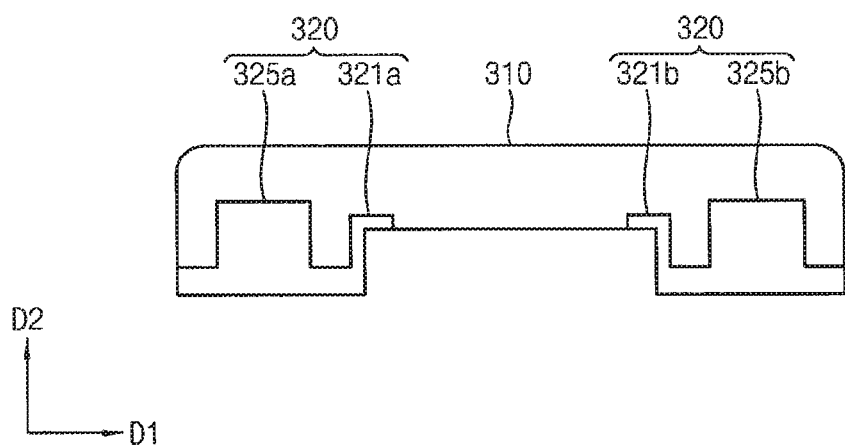
FIG. 3A is a front view illustrating the flexible circuit film of FIG. 2.
Figure 3B:
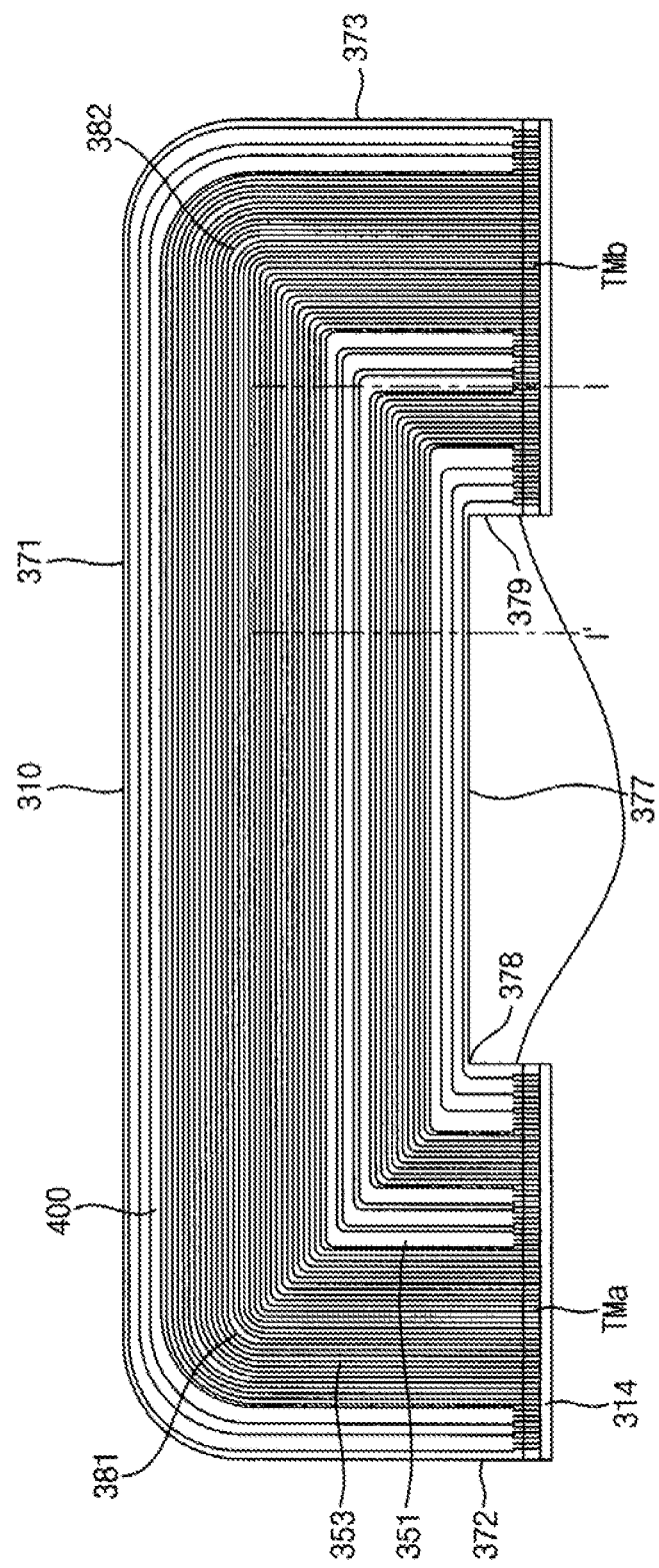
FIG. 3B is a rear view illustrating the flexible circuit film of FIG. 2.
Figure 4:
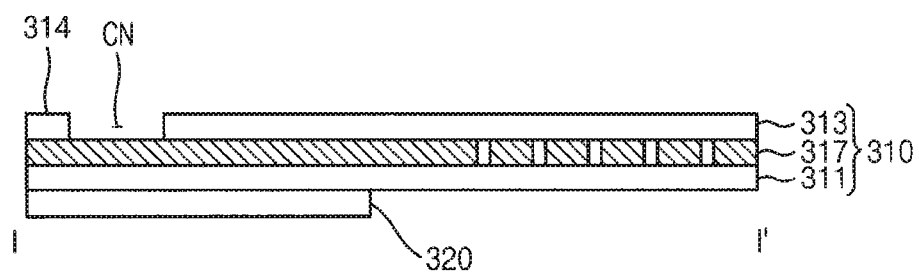
FIG. 4 is a cross-sectional view taken in the line I-I' of FIG. 3B.

Turning now to FIGS. 3A, 3B and 4, FIG. 3A is a front view illustrating the flexible circuit film of FIG. 2, FIG. 3B is a rear view illustrating the flexible circuit film of FIG. 2 and FIG. 4 is a cross-sectional view taken in the line I-I' of FIG. 3B. Referring to FIGS. 3A, 3B and 4, the flexible circuit film 300 may include a flexible part 310 and a guide film 320. The flexible part 310 may include a first flexible film 311, a second flexible film 313 and a plurality of wirings 317.

The first flexible film 311 and the second flexible film 313 may include an insulating material having flexibility. The first flexible film 311 and the second flexible film 313 may have a proper transparency. The wirings 317 have been omitted in FIG. 3A for ease of explanation. For example, the first flexible film 311 and the second flexible film 313 may have a U-shape to cover the wirings 317. This U-shape includes a base portion 371 (see FIG. 3B) and two branch portions 372 and 373 extending from opposite ends of base portion 371. The U-shape flexible circuit film also includes an inner edge 377 of the U-shape and two corners 378 and 379 where the branches 372 and 373 meet the base 371 along the inner edge 377.

The wirings 317 may be arranged between the first flexible film 311 and the second flexible film 313. For example, the wirings 317 may include a conductive material. For example, the wirings 317 may include copper, silver, or the like. The wirings 317 may have flexibility to be capable of bending with the flexible films 311 and 313.

The wirings 317 may extend and bend to have a U-shape. For example, the wirings 317 extend in the second direction D2 along first branch 372, and include a first bend 381 to extend in the first direction D1 along base 371, and include a second bend 382 to extend in a direction opposite to the second direction D2 along second branch 373. The wirings 317 may be arranged to be spaced apart from each other by a distance between the first flexible film 311 and the second flexible film 313.

The wirings 317 may include a power supply line 351, a ground line, image signal supplying lines 353 and the like. A width of the power supply line 351 may be greater than a width of each of the image signal supplying lines 353. Furthermore, a width of the ground line may be greater than a width of each of the image signal supplying lines 353. Specifically, the power supply line 351 may apply a gamma power, and a width of the power supply line 351 supplying a gamma power may be about 200 μm to about 250 μm.

Referring to FIGS. 3A and 4, the guide film 320 may be arranged on the first flexible film 311. For example, the guide film 320 may be arranged on a rear surface of the first flexible film 311. The guide film 320 may include a more rigid material than that of the flexible films 311 and 313. For example, the guide film 320 may include polyethylene terephthalate when the flexible films 311 and 313 include polyamide or polyimide.

The guide film 320 may be arranged to correspond to ends of the branch portions 372 and 373 of the first flexible film 311. For example, the guide film 320 may overlap with ends of the wirings 317. The guide film 320 may include tear-preventing portions 321a and 321b that may overlap with an inner edge 377 of the U-shape of the flexible part 310 and the flexible circuit film 300. For example, the tear-preventing portions 321a and 321b may each have an L-shape. The tear-preventing portion 321a and 321b may extend along the inner edge 377 of the U-shape in the first direction D1, the second direction D2 or opposing direction thereof. In addition, the tear-preventing portions 321a and 321b may overlap with bent portions 381 and 382 of the shortest (i.e. innermost) one of the wirings 317.

According to the above, as the guide film 320 of the flexible circuit film 300 includes the tear-preventing portions 321a and 321b, the flexible part 310 of the flexible circuit film 300 may be prevented from being physically damaged. For example, when the flexible circuit film 300 is coupled to a printed circuit board 230, a corner (or bent) portion 378 and 379 at the inner edge 377 of the flexible part 310 of flexible circuit film 300 may be prevented from being torn by an operator.

The guide film 320 may further include handling portions 325a and 325b that the operator can grab when the flexible circuit film 300 is coupled to the printed circuit board 230. The handling portions 325a and 325b may extend in the second direction D2. The handling portions 325a and 325b may overlap continuously with at least two wirings in an arranging direction of the wirings 317. The tear-preventing portions 321a and 321b and the handling portions 325a and 325b of the guide film 320 may be integrally formed with each other.

Referring now to FIGS. 3B and 4, the second flexible film 313 may cover the wirings 317 arranged on the first flexible film 311. The second flexible film 313 may include a terminal groove CN exposing opposing ends of the wirings 317. Terminal portions TMa and TMb of the wirings 317, which are exposed through the terminal grooves CN, may contact and form an electrical connection to a connecting portion on the printed circuit board 230. The second flexible film 313 may further include a protective portion 314 that protects ends of the terminal portions TMa and TMb of the wirings 317. The protective portion 314 may extend in the arranging direction of the wirings 317 and be arranged on ends of the terminal portions TMa and TMb of the wirings 317 so that the terminal groove CN may have an appropriate width.

According to the above, ends of the wirings 317 are partially covered by the protective portion 314. Thus, even if an external impact is applied to the flexible circuit film 300, the ends of the wirings 317 may be prevented from being separated from the first flexible film 311.

The tear-preventing portions 321a and 321b of the flexible circuit film 300 each has an L-shape in FIG. 3A. However, FIG. 3A is illustrative and is not to be construed as limiting thereof, as the tear-preventing portion 321a and 321b may instead have different shapes that can protect an inner edge 377 of the flexible circuit film 300 having a U-shape. For example, the tear-preventing portions 321a and 321b may have a fan shape spanning about 270 degrees of an inner angle as in FIG. 6A. Furthermore, the handling portions 325a and 325b of the flexible circuit film 300 may instead have a rectangular shape in FIG. 3A. However, FIG. 3A is illustrative and is not to be construed as limiting thereof, as the handling portion 325a and 325b may also have different shapes that can secure ends of the flexible circuit film 300.

Figure 5A:
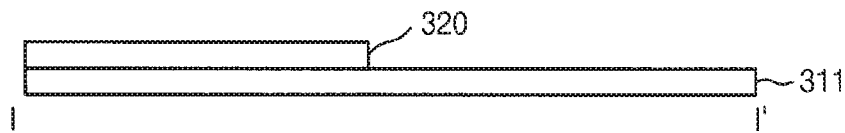
FIGS. 5A to 5D are cross-sectional views illustrating a method of manufacturing the flexible circuit film illustrated in FIG. 4.

Turning now to FIGS. 5A to 5D, FIGS. 5A to 5D are cross-sectional views illustrating a method of manufacturing the flexible circuit film illustrated in FIG. 4. Referring now to FIG. 5A, a guide film 320 is provided on a first flexible film 311. The first flexible film 311 may have a U-shape. The first flexible film 311 may include an insulating material having flexibility. The guide film 320 may be arranged on a first surface of the first flexible film 311 to overlap with an end of the first flexible film 311. The guide film 320 may include a more rigid material than that of the first flexible film 311. The guide film 320 may further include a tear-preventing portion and a handling portion.

Figure 5B:
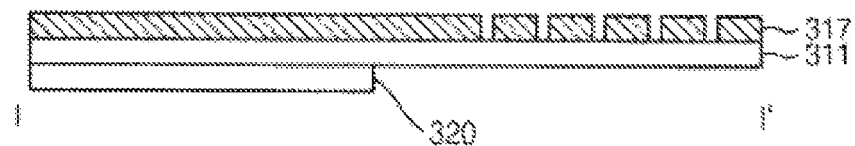

Referring to FIG. 5B, wirings 317 may be provided on a second surface of the first flexible film 311. The wirings 317 may be arranged to form a U-shape on the first flexible film 311, may be arranged to be parallel to each other, and may have different widths. The wirings 317 may include a power supply line, a ground line, image signal supplying lines or the like. For example, at least one of the power supply line and the ground line may have a width greater than that of each of the image signal supplying lines.

Figure 5C:
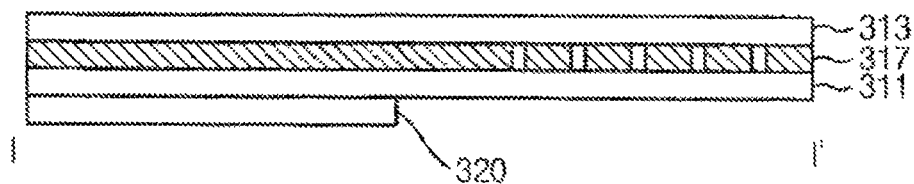

Referring now to FIG. 5C, a second flexible film 313 may be provided on the first flexible film 311 including the wirings 317. The second flexible film 313 may entirely cover the wirings 317.

Figure 5D:
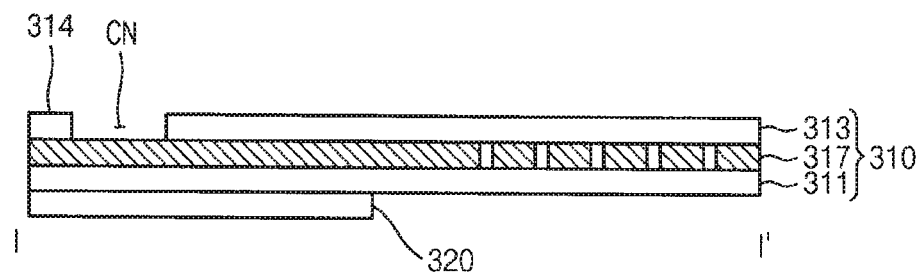

Referring now to FIG. 5D, a portion of the second flexible film 313 is removed to expose ends of the wirings 317. For example, a terminal groove CN exposing terminal portions of the wirings 317 may be formed at ends of the second flexible film 313, however a protective portion 314 of the second flexible film 313 may still be arranged on ends of the terminal portions of the wirings 317.

In the embodiment, the guide film 320 is provided on a first surface of the first flexible film 311 before the wirings 317 are provided. In another embodiment, the guide film 320 may be provided on the first surface of the first flexible film 311 after the wirings 317 are provided on a second surface of the first flexible film 311, and after the second flexible film 313 is provided on the wirings 317.

Figure 6A:
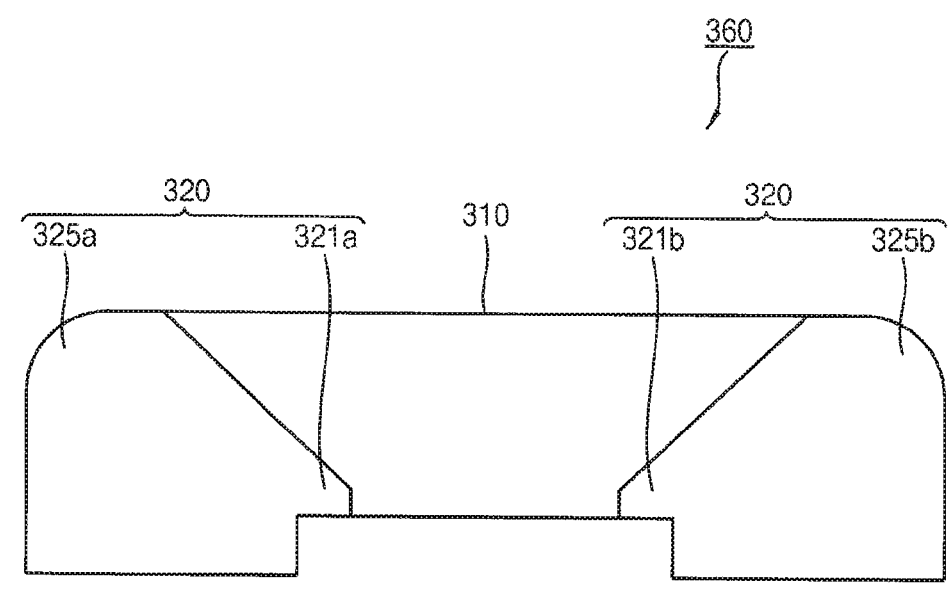
FIG. 6A is a front view illustrating a flexible circuit film according to a second exemplary embodiment.
Figure 6A:
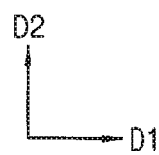
Figure 6B:
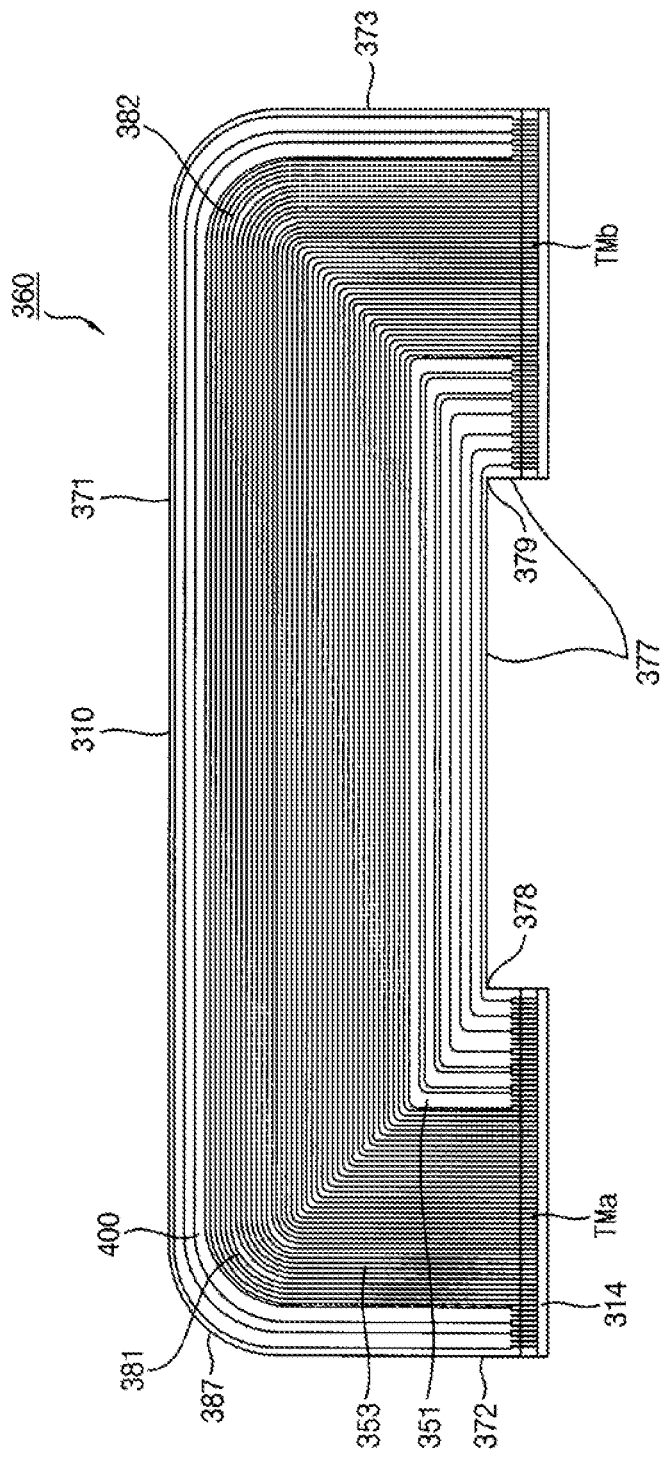
FIG. 6B is a rear view illustrating the flexible circuit film of FIG. 6A.

Turning now to FIGS. 6A and 6B, FIG. 6A is a front view illustrating a flexible circuit film 360 according to a second exemplary embodiment and FIG. 6B is a rear view illustrating the flexible circuit film of FIG. 6A.

Referring now to FIGS. 6A and 6B, a flexible circuit film 360 according to the second exemplary embodiment is substantially same as the flexible circuit film illustrated in FIGS. 3A and 3B except for a shape of a guide film 320 and a position of a power supply line 351. Thus, any duplicative explanation may be omitted.

The flexible circuit film 360 may include a flexible part 310 and a guide film 320. The flexible part 310 may include a first flexible film, a second flexible film and a plurality of wirings. The first flexible film and the second flexible film may each include an insulating material having flexibility. The first flexible film and the second flexible film may have, for example, a U-shape to cover the wirings. The flexible circuit film 360 having a U-shape has a base portion 371 and two branch portions 372 and 373. In addition, flexible circuit film 360 has an inner edge 377 having inner corners 378 and 379. The wirings of the flexible part 310 are omitted in FIG. 6A for ease of explanation.

The wirings may be arranged between the first flexible film and the second flexible film, may include a conductive material such as copper, silver, or the like, and may have flexibility to be capable of bending with the flexible films.

The wirings may extend and bend to have a U-shape that includes a base and branches extending perpendicularly from opposite ends of the base. For example, one of the branches of the wirings extend in a second direction D2 corresponding to first branch 372 to connect to the base at a first bend 381, and then the base extends in a first direction D1 perpendicular to the second direction D2 to the second branch at a second bend 382, and then the second branch extends in a direction opposite to the second direction D2 from the second bend to correspond to the second branch 373. The wirings may be arranged to be spaced apart from each other by a distance between the first flexible film and the second flexible film.

The wirings may include a power supply line 351, a ground line, and image signal supplying lines 353 or the like. A width of the power supply 351 may be greater than a width of each of the image signal supplying lines 353. Also, a width of the ground line may be greater than a width of each of the image signal supplying lines 353. The power supply line 351 may be used to apply a gamma power, and a width of the power supply line 351 supplying a gamma power may be about 200 μm to about 250 μm.

In the second embodiment, the power supply line 351 and the ground line may be arranged adjacent to an outer edge or an inner edge of the flexible part 310 having a U-shape. For example, the power supply line 351 may be arranged adjacent to the inner edge 377 of the flexible part 310 having the U-shape. Because the power supply line 351 having a relatively greater width is arranged adjacent to the inner edge 377 of the flexible part 310 having the U-shape where the inner edge is otherwise relatively easily damaged, electrical characteristics of the wirings may be maintained, even if an external impact is applied to the flexible part 310.

The guide film 320 may be arranged on the first flexible film. For example, the guide film 320 may be arranged on a rear surface of the first flexible film. The guide film 320 may include a more rigid material than that of the flexible films.

The guide film 320 may be arranged at an edge of the first flexible film. For example, the guide film 320 may overlap with ends of the wirings corresponding to terminal ends of the branches. The guide film 320 may include tear-preventing portions 321a and 321b that may overlap with portions of the inner edge 377 of the U-shape of the flexible part. The tear-preventing portions 321a and 321b may extend from the inner edge 377 of the U-shape in the first direction D1, the second direction D2 or opposing directions thereof. For example, the tear-preventing portions 321a and 321b may overlap with the bends of the shortest one of the wirings. Furthermore, the tear-preventing portion 321a and 321b may further overlap with the bends of the longest one of the wirings. The guide film 320 may further include a handling portion 325a and 325b that overlaps the bend portions of the wirings 381 and 382 at the outer edge 387 of the U-shape. Specifically, the tear-preventing portions 321a and 321b and the handling portions 325a and 325b of the guide film 320 may be integrally formed with each other and may overlap with bent portions 381 and 382 of all the wirings.

According to the above, because the guide film 320 of the flexible circuit film includes the tear-preventing portion 321a and 321b, the flexible part 310 of the flexible circuit film may be prevented from being physically damaged. For example, when the flexible circuit film is coupled to a printed circuit board, the bent portions 381 and 382 of the inner edges 377 of the flexible part may be prevented from being torn by an operator. Furthermore, when the flexible circuit film is coupled to the printed circuit board, the bent portions 381 and 382 of the outer edges 387 of the flexible part may be prevented from being torn by an operator.

The second flexible film may cover the wirings arranged on the first flexible film. The second flexible film may include terminal grooves exposing opposing ends of the wirings. Terminal portions TMa and TMb of the wirings, which are exposed through the terminal grooves CN, may contact and electrically connect to a connecting portion of the printed circuit board. The second flexible film may further include a protective portion 314 that protects ends of the terminal portions TMa and TMb of the wirings and may extend in an arranging direction of the wirings.

According to the above, ends of the wirings are partially covered by the protective portion 314. Thus, even if an external impact is applied to the flexible circuit film, the ends of the wirings may be prevented from being separated from the first flexible film.

Figure 7:
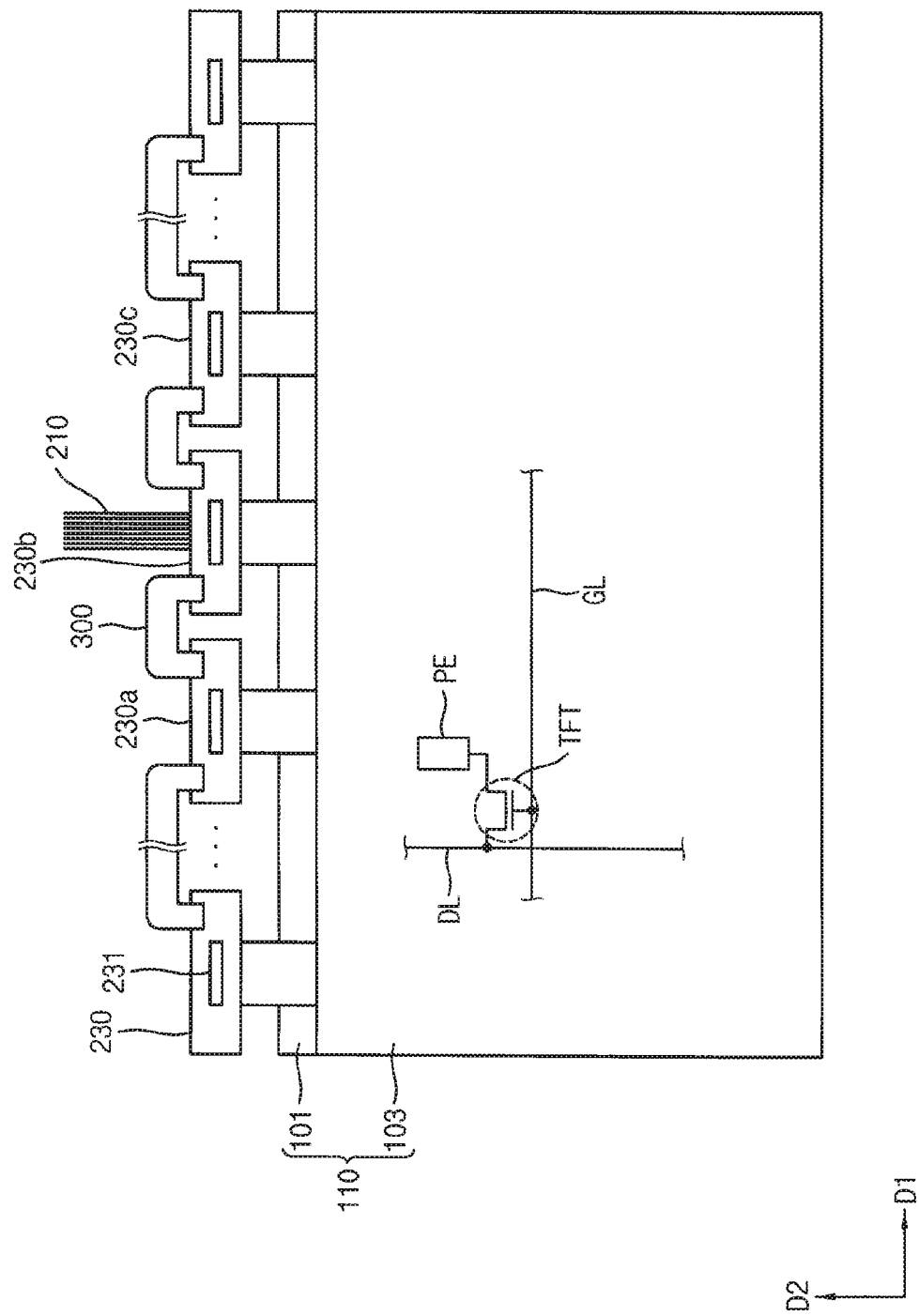
FIG. 7 is a plan view illustrating a display apparatus according to a second exemplary embodiment.

Turning now to FIG. 7, FIG. 7 is a plan view illustrating a display apparatus according to a second exemplary embodiment.

Referring now to FIG. 7, a display apparatus according to the second exemplary embodiment is substantially same as the display apparatus illustrated in FIG. 1 except for including just one host line 210 connected to the chain of printed circuit boards 230. Thus, any duplicative explanation may be omitted.

The display apparatus according to the exemplary embodiment includes a display panel 110 and a driver. Examples of the display panel 110 may include an organic electroluminescent display panel, a liquid crystal display panel, an electrowetting display panel, an electrophoretic display panel, a microelectromechanical system display panel, a plasma display panel and the like. In the embodiment, the display panel includes a liquid crystal display panel.

The display panel 110 includes an array substrate 101, an opposing substrate 103 facing the array substrate 101, and a liquid crystal layer interposed between the array substrate 101 and the opposing substrate 103. The array substrate 101 may include a plurality of gate lines GL extending in a first direction D1, a plurality of data lines DL intersecting with the gate lines GL and extending in a second direction D2, a plurality of switching elements TFT electrically connected to the gate lines GL and the data lines DL, and a plurality of pixel electrodes PE electrically connected to the switching elements TFT. The array substrate 101 or the opposing substrate 103 may further include a common electrode (not shown) that forms an electric field with the pixel electrodes PE. The display panel 110 has a first length in the first direction D1 that is greater than a second length in the second direction D2.

The driver may include a plurality of printed circuit boards 230, and a plurality of flexible circuit films 300 electrically connecting the printed circuit boards 230 to each other to deliver signals from the host line 210 to each of the printed circuit boards 230. The printed circuit boards 230 may include a driving chip 231 for providing electrical signals to the gate lines GL and the data lines DL. The printed circuit boards 230 may be arranged adjacent to the display panel 110. For example, the printed circuit boards 230 may be arranged to face a side of the display panel 110 in the first direction D1. As illustrated in FIG. 7, a first printed circuit board 230a, a second printed circuit board 230b, and a third printed circuit board 230c may be arranged to face a side of the display panel 110 that extends in the first direction D1.

At least one of the printed circuit boards 230 may be connected to a host line 210, for receiving electrical signals from an external device. The host line 210 may provide a power signal, image signals or the like. More specifically, the host line 210 may provide a gamma power signal, a gate driving signal, a data driving signal or the like. As illustrated in FIG. 7, the second printed circuit board 230b may be arranged at a center portion of the display panel 110 and may be directly connected to the host line 210 to receive electrical signals from the host line 210.

The remaining printed circuit boards 230a and 230c that are not directly connected to the host line 210 receive electrical signals from the host line 210 via the second printed circuit board 230b and a flexible circuit film 300. For example, the first printed circuit board 230a is arranged adjacent to the second printed circuit board 230b in an opposing direction to the first direction D1, and receives electrical signals from the host line 210 via the second printed circuit board 230b and the flexible circuit film 300. The printed circuit boards adjacent to each other may receive or provide electrical signals via the flexible circuit film 300. Thus, electrical signals provided by the host line 210 may be transferred to all printed circuit boards arranged in the opposing direction to the first direction D1 by way of the second printed circuit board 230b and the flexible circuit films 300.

The third printed circuit board 230c is arranged adjacent to the second printed circuit board 230b in the first direction D1, and receives electrical signals from the host line 210 via the second printed circuit board 230b and the flexible circuit film 300. The printed circuit boards adjacent to each other may receive or provide electrical signals through the flexible circuit film 300. Thus, electrical signals provided by the host line 210 may be transferred to all printed circuit boards arranged in the first direction D1 by way of the second printed circuit board 230b.

According to the above, electrical signals provided from an external device through the host line 210 can be transferred to the printed circuit boards 230 through flexible circuit film 300s. Thus, the received electrical signals may be appropriately applied to the data lines DL and the gate lines GL, even in a large-screen display apparatus.

In the flexible circuit films and the display apparatuses according to the exemplary embodiments, the flexible circuit films electrically connecting printed circuit boards includes a tear-preventing portion that overlaps with an inner edge of a U-shape and protects wirings. Thus, the flexible circuit films may be prevented from being torn, and a reliability of a device employing the flexible circuit films may be improved.

Furthermore, ends of the wirings of the flexible circuit films, which correspond to terminal portions connected to a printed circuit board, are covered by a protective portion. Thus, ends of the wirings may be prevented from being lifted or damaged by an external impact. Thus, a reliability of a device employing the flexible circuit films may be improved.

Furthermore, because widths of a power supply line and a ground line, to which higher voltages are applied, are greater than widths of image signal supplying lines, to which a lower voltage is applied, an electrical stability of the wirings may be improved.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure.

What is claimed is:

1. A display apparatus, comprising:
   a display panel; and
   a driver including a plurality of printed circuit boards and a flexible circuit film electrically connecting the printed circuit boards, the driver being configured to apply electrical signals to the display panel,
   wherein:
   the flexible circuit film comprises:
      a first flexible film;
      a second flexible film facing the first flexible film; and
      a plurality of wirings arranged between the first flexible film and the second flexible film;
   each of the wirings has a first portion extending in a second direction from a first terminal portion to a first part, a second portion extending in a first direction different from the second direction from the first part to a second part, and a third portion extending in a direction opposite to the second direction from the second part to a second terminal end portion;
   the wirings comprise a first wiring, a second wiring, and a plurality of third wirings between the first wiring and the second wiring in an arranging direction of the wirings; and
   each of a first width of the first wiring and a second width of the second wiring is larger than a third width of each of the third wirings.

2. The display apparatus of claim 1, wherein the second flexible film includes a terminal groove exposing one of the first and second terminal portions of the wirings.

3. The display apparatus of claim 1, wherein:
   the first and second flexible films have a U-shape that includes a base portion that corresponds to the second portions of the wirings that extend in the first direction and two branches extending from opposite ends of the base portion and corresponding to the first and third portions of the wirings extending in the second direction and the direction opposite to the first direction, respectively; and
   the first and second flexible films comprise an inner edge having two inner corners that correspond to an inner portion of the U-shape where the branches meet the base.

4. The display apparatus of claim 1, wherein the first or second wiring is a power supply line or a ground line, and the third wirings include an image signal supplying line.

5. A display apparatus, comprising:
   a display panel; and
   a driver including a plurality of printed circuit boards and a flexible circuit film electrically connecting the printed circuit boards, the driver connected to the display panel,
   wherein:
   the flexible circuit film comprises:
      a first flexible film;
      a second flexible film facing the first flexible film; and
      a plurality of wirings arranged between the first flexible film and the second flexible film;
   each of the wirings has a first portion extending in a second direction from a first terminal portion to a first part, a second portion extending in a first direction different from the second direction from the first part to a second part, and a third portion extending in a direction opposite to the second direction from the second part to a second terminal end portion;
   the wirings comprise a first wiring, a second wiring, and a plurality of third wirings between the first wiring and the second wiring in an arranging direction of the wirings;
   each of a first width of the first wiring and a second width of the second wiring is larger than a third width of each of the third wirings; and
   the second flexible film includes a protective portion extending in an arranging direction of the wirings and partially covering the one of the first and second terminal end portions of the wirings.

6. The display apparatus of claim 5, wherein the second flexible film further includes a terminal groove exposing one of the first and second terminal portions of the wirings.

7. The display apparatus of claim 5, wherein:
   the first and second flexible films have a U-shape that includes a base portion that corresponds to the second portions of the wirings that extend in the first direction and two branches extending from opposite ends of the base portion and corresponding to the first and third portions of the wirings extending in the second direction and the direction opposite to the first direction, respectively; and the first and second flexible films comprise an inner edge having two inner corners that correspond to an inner portion of the U-shape where the branches meet the base.

8. The display apparatus of claim 5, wherein the first or second wiring is a power supply line or a ground line, and the third wirings include an image signal supplying line.

9. A flexible circuit film, comprising:
a first flexible film
a second flexible film facing the first flexible film;
a plurality of wirings arranged between the first flexible film and the second flexible film;
wherein:
each of the wirings has a first portion extending in a second direction from a first terminal portion to a first part, a second portion extending in a first direction different from the second direction from the first part to a second part, and a third portion extending in a direction opposite to the second direction from the second part to a second terminal end portion;
the wirings comprise a first wiring, a second wiring, and a plurality of third wirings between the first wiring and the second wiring in an arranging direction of the wirings;
each of a first width of the first wiring and a second width of the second wiring is larger than a third width of each of the third wirings; and
the second flexible film includes a protective portion extending in an arranging direction of the wirings and partially covering the one of the first and second terminal end portions of the wirings.

10. The flexible circuit film of claim 9, wherein the second flexible film further includes a terminal groove exposing one of the first and second terminal portions of the wirings.

11. The flexible circuit film of claim 9, wherein:
the first and second flexible films have a U-shape that includes a base portion that corresponds to the second portions of the wirings that extend in the first direction and two branches extending from opposite ends of the base portion and corresponding to the first and third portions of the wirings extending in the second direction and the direction opposite to the first direction, respectively; and
the first and second flexible films comprise an inner edge having two inner corners that correspond to an inner portion of the U-shape where the branches meet the base.

12. The flexible circuit film of claim 9, wherein the first or second wiring is a power supply line or a ground line, and the third wirings include an image signal supplying line.

13. A flexible circuit film, comprising:
a first flexible film;
a second flexible film facing the first flexible film;
a plurality of wirings arranged between the first flexible film and the second flexible film and extending in a first direction from a first terminal end portion to a first bend, then extending in a second direction crossing the first direction between the first bend and a second bend, and then extending in an opposing direction to the first direction from the second bend to a second and opposite terminal end portion; and a guide film including a material having higher rigidity than that of the first and second flexible films and arranged on the first flexible film at locations corresponding to the first and second terminal end portions of the wirings,
wherein the guide film includes handling portions that overlap continuously with at least two wirings in an arranging direction of the wirings.

14. The flexible circuit film of claim 13, wherein the guide film includes a tear-preventing portion overlapping the first and second bends of a shortest one of the wirings.

15. The flexible circuit film of claim 14, wherein the tear-preventing portion and the handling portions are integrally formed with each other.

16. The flexible circuit film of claim 13, wherein at least two of the wirings have different widths from each other.

17. The flexible circuit film of claim 13, wherein:
the wirings include a power supply line, a ground line and a plurality of image signal supplying lines; and
at least one of the power supply line and the ground line has a width greater than that of each of the image signal supplying lines.

18. A flexible circuit film, comprising:
a first flexible film;
a second flexible film facing the first flexible film;
a plurality of wirings arranged between the first flexible film and the second flexible film and extending in a first direction from a first terminal end portion to a first bend, then extending in a second direction crossing the first direction between the first bend and a second bend, and then extending in an opposing direction to the first direction from the second bend to a second and opposite terminal end portion; and
a guide film arranged on the first flexible film at locations corresponding to the first and second terminal end portions of the wirings,
wherein:
the guide film includes handling portions that overlap continuously with at least two wirings in an arranging direction of the wirings; and
the first and second flexible films have a U-shape that includes a base portion that corresponds to a portion of the wirings that extend in the second direction and two branches extending from opposite ends of the base portion and corresponding to portions of the wirings extending in the first direction and opposing the first direction.

19. The flexible circuit film of claim 18, wherein the guide film includes a tear-preventing portion overlapping the first and second bends of a shortest one of the wirings.

20. The flexible circuit film of claim 19, wherein the tear-preventing portion and the handling portions are integrally formed with each other.

21. A display apparatus, comprising:
a display panel; and
first and second printed circuit boards and a flexible circuit film electrically connecting the first and second printed circuit boards,
wherein:
the flexible circuit film comprises:
a first flexible film;
a second flexible film facing the first flexible film; and
a plurality of wirings arranged between the first flexible film and the second flexible film;
at least one of the wirings has a first portion extending in a second direction from a first terminal portion to a first part, a second portion extending in a first direction different from the second direction from the first part to a second part, and a third portion extending in a direction opposite to the second direction from the second part to a second terminal end portion;

the wirings comprise a plurality of first wirings, a plurality of second wirings, and a plurality of third wirings between the first wirings and the second wirings; and a first width of at least one of the first wirings is larger than a third width of at least one of the third wirings.

22. The display apparatus of claim 21, wherein the second flexible film includes a terminal groove exposing one of the first and second terminal portions of the wirings.

23. The display apparatus of claim 21, wherein:

the first and second flexible films have a U-shape that includes a base portion that corresponds to the second portions of the wirings that extend in the first direction and two branches extending from opposite ends of the base portion and corresponding to the first and third portions of the wirings extending in the second direction and the direction opposite to the first direction, respectively; and the first and second flexible films comprise an inner edge having two inner corners that correspond to an inner portion of the U-shape where the branches meet the base.

24. The display apparatus of claim 21, wherein the first wirings or the second wirings include a power supply line or a ground line, and the third wirings include an image signal supplying line.

* * * * *